United States Patent
Eun et al.

(10) Patent No.: US 7,746,086 B2
(45) Date of Patent: Jun. 29, 2010

(54) NON-CONTACT TYPE APPARATUS FOR TESTING OPEN AND SHORT CIRCUITS OF A PLURALITY OF PATTERN ELECTRODES FORMED ON A PANEL

(75) Inventors: Tak Eun, Gyeonggi-do (KR); Seong Jin Kim, Seoul (KR); Hee Dok Choi, Incheon (KR); Dong Jun Lee, Seoul (KR); Jong In Park, Seoul (KR); Woo Chul Cho, Incheon (KR)

(73) Assignee: Microinspection, Inc., Seoul (KR)

( * ) Notice: Subject to any disclaimer, the term of this patent is extended or adjusted under 35 U.S.C. 154(b) by 206 days.

(21) Appl. No.: 11/826,147

(22) Filed: Jul. 12, 2007

(65) Prior Publication Data
US 2008/0018339 A1    Jan. 24, 2008

(30) Foreign Application Priority Data
Jul. 20, 2006    (KR) .................... 10-2006-0068231

(51) Int. Cl.
G01R 27/08    (2006.01)
G01R 31/02    (2006.01)
(52) U.S. Cl. ..................................... 324/713; 324/72.5
(58) Field of Classification Search .................. 324/713
See application file for complete search history.

(56) References Cited

U.S. PATENT DOCUMENTS

| | | | | |
|---|---|---|---|---|
| 5,218,294 A | * | 6/1993 | Soiferman | 324/158.1 |
| 5,517,110 A | * | 5/1996 | Soiferman | 324/158.1 |
| 7,003,412 B2 | * | 2/2006 | Jensen et al. | 702/64 |
| 7,629,796 B2 | * | 12/2009 | Eun et al. | 324/537 |
| 2002/0079458 A1 | * | 6/2002 | Zur | 250/370.11 |
| 2003/0083537 A1 | * | 5/2003 | Ardizzone | 600/9 |

FOREIGN PATENT DOCUMENTS

| | | |
|---|---|---|
| EP | 0 581 556 A2 | 2/1994 |
| JP | A-08-146046 | 6/1996 |
| JP | A-08-160080 | 6/1996 |

* cited by examiner

Primary Examiner—Jeff Natalini
(74) Attorney, Agent, or Firm—Oliff & Berridge, PLC

(57) ABSTRACT

Disclosed herein are a noncontact single side probe and an apparatus and method for testing open and short circuits of pattern electrodes. By feeding power to one end of each of the pattern electrodes and sensing an electrical variation value using a noncontact type single side probe device including an exciter electrode and a sensor electrode as a single module, the open and short circuits of pattern electrodes can be tested by one scanning process. Since the open and short circuits of the pattern electrodes are tested using the noncontact type single side probe device, the pattern electrode can be prevented from being damaged due to a contact failure or pressurized contact and the life span of the probe device can increase compared with a contact type probe device.

13 Claims, 4 Drawing Sheets

NON-CONTACT TYPE APPARATUS FOR TESTING OPEN AND SHORT CIRCUITS OF A PLURALITY OF PATTERN ELECTRODES FORMED ON A PANEL

BACKGROUND OF THE INVENTION

1. Field of the Invention

The present invention relates to a noncontact type single side probe device and an apparatus and method for testing open or short circuits of pattern electrodes using the same, and more particularly to a noncontact type single side probe device capable of testing open and short circuits of pattern electrodes by feeding AC power to one end of each of the pattern electrodes and sensing an electrical variation value using a noncontact type single side probe device including an exciter electrode and a sensor electrode of a noncontact probe electrode as a single module, and an apparatus and method for testing the open and short circuits of the pattern electrodes using the same.

2. Description of the Related Art

Generally, open and short circuit in a multi-line cable such as data transmission lines are detected by measuring a resistance between both ends of the cable after each line is separated from the other lines. Accordingly, two or more operators are necessarily required. In case of the cable including a large number of lines, occasionally, a line number is lost and the detection should be repeated, thereby lowering detection reliability and increasing the operation time.

Further, as shown in FIG. 1, in a flat plate display device 10 (e.g., LCD and PDP), open and short circuit may be detected by applying current to one end of each pattern electrode 15 and measuring a voltage at the other end of the corresponding pattern electrode 15. Also, the open and short circuit may be detected by checking conducting lines with a microscope and the like. In FIG. 1, reference numeral 20 denotes a probe block, and reference numeral 30 denotes a pin probe.

Accordingly, at least two probes are required in order to detect the open and short circuit in a single pattern electrode. Thus, a number of probes are required and the cost is increased. Further, a long pattern electrode requires two or more operators for the measurement at different positions, thereby taking a lot of time and man power.

Further, in case of a contact type probe, since the probe is in press-contact with the pattern electrode, a contact error may occur. Further, a scratch may be generated on the pattern electrode serving as a measurement target, thereby causing another error.

SUMMARY OF THE INVENTION

Therefore, the present invention has been made in view of the above problems, and it is an object of the present invention to provide a noncontact type single side probe device capable of testing open and short circuits of pattern electrodes by feeding AC power to one end of each of the pattern electrodes and sensing an electrical variation value using a noncontact type single side probe device including an exciter electrode and a sensor electrode of a noncontact probe electrode as a single module, and an apparatus and method for testing the open and short circuits of the pattern electrodes using the same.

It is another object of the present invention to provide a noncontact type single side probe device capable of improving spatial resolution and a signal-to-noise ratio by including a pair of exciter electrodes and a pair of sensor electrodes of a noncontact probe electrode, applying voltages having opposite phases to the pair of exciter electrodes, and using a differential voltage of the pair of sensor electrodes, and an apparatus and method for testing the open and short circuits of the pattern electrodes using the same.

In accordance with an aspect of the present invention, the above and other objects can be accomplished by the provision of a noncontact type single side probe device including: a noncontact probe electrode which feeds power to a pattern electrode to be tested in a noncontact state and senses an electrical variation value; a power feeding section which applies AC power to the noncontact probe electrode; and a sensor which measures the electrical variation value of the noncontact probe electrode.

Preferably, the power feeding section may include an AC current source for applying AC current, and the sensor measures a variation in voltage.

Preferably, the noncontact probe electrode may include an exciter electrode which is connected to the power feeding section, for applying the AC current; and a sensor electrode which is connected to the sensor, for sensing the variation in voltage.

Preferably, the exciter electrode and the sensor electrode of the noncontact probe electrode may be integrally formed with each other.

Preferably, the power feeding section may include an AC voltage source for applying an AC voltage, and the sensor measures a variation in voltage.

Preferably, the noncontact probe electrode may include an exciter electrode which is connected to the power feeding section, for applying the AC voltage; and a sensor electrode which is connected to the sensor, for sensing the variation in voltage.

Preferably, the power feeding section may include an AC voltage source for applying an AC voltage, and the sensor measures a variation in current flowing between the AC voltage source and the noncontact probe electrode.

Preferably, the noncontact probe electrode may include first and second exciter electrodes which feed the AC voltage; and first and second sensor electrodes which measure the variation in voltage.

Preferably, the first exciter electrode and the first sensor electrode may be arranged on a linear axis, the second exciter electrode, the second sensor electrode may be arranged on a linear axis, the first and second exciter electrode may be arranged in parallel, and the first and second sensor electrodes may be arranged in parallel.

Preferably, the first exciter electrode and the first sensor electrode may be arranged on a linear axis, the second exciter electrode and the second sensor electrode may be arranged on a linear axis, and the first and second exciter electrode and the first and second sensor electrodes may be respectively arranged to be diagonally symmetrical to each other.

Preferably, the power feeding section may respectively feed AC voltages having same amplitude and a 180 degree inverted phase relationship to the first and second exciter electrodes.

Preferably, the sensor may measure a differential voltage between the voltages measured by the first and second sensor electrodes.

In accordance with another aspect of the present invention, there is provided an apparatus for testing of open and short circuits of a plurality of pattern electrodes formed on a panel while scanning the pattern electrodes using a noncontact type single side probe device, the apparatus including: the noncontact type single side probe device which feeds AC power to one end of each of the pattern electrodes through a noncontact probe electrode and measures an electrical variation value of the non-contact probe electrode; a signal processing section which determines the open and short circuits by the electrical variation value measured by the noncontact type single side probe device.

Preferably, the noncontact type single side probe device may include: the noncontact probe electrode which feeds power to a pattern electrode in a noncontact state and senses the electrical variation value; a power feeding section which applies the AC power to the noncontact probe electrode; and a sensor which measures the electrical variation value of the noncontact probe electrode.

Preferably, the power feeding section may include an AC current source for applying AC current, and the sensor measures a variation in voltage.

Preferably, the noncontact probe electrode may include: an exciter electrode which is connected to the power feeding section, for applying the AC current; and a sensor electrode which is connected to the sensor, for sensing the variation in voltage.

Preferably, the exciter electrode and the sensor electrode of the noncontact probe electrode may be integrally formed with each other.

Preferably, the power feeding section may include an AC voltage source for applying an AC voltage, and the sensor measures a variation in voltage.

Preferably, the noncontact probe electrode may include an exciter electrode which is connected to the power feeding section, for applying the AC voltage; and a sensor electrode which is connected to the sensor, for sensing the variation in voltage.

Preferably, the power feeding section may include an AC voltage source for applying an AC voltage, and the sensor measures a variation in current flowing between the AC voltage source and the noncontact probe electrode.

Preferably, the noncontact probe electrode may include first and second exciter electrodes which feed the AC voltage; and first and second sensor electrodes which measure the variation in voltage.

Preferably, the first exciter electrode and the first sensor electrode may be arranged on a linear axis, the second exciter electrode and the second sensor electrode may be arranged on a linear axis, the first and second exciter electrode may be arranged in parallel, and the first and second sensor electrodes may be arranged in parallel.

Preferably, the first exciter electrode and the first sensor electrode may be arranged on a linear axis, the second exciter electrode and the second sensor electrode may be arranged on a linear axis, and the first and second exciter electrodes and the first and second sensor electrodes may be respectively arranged to be diagonally symmetrical to each other.

Preferably, the power feeding section may respectively feed AC voltages having same amplitude and a 180 degree inverted phase relationship to the first and second exciter electrodes.

Preferably, the sensor may measure a differential voltage between the voltages measured by the first and second sensor electrodes.

In accordance with yet another aspect of the present invention, there is provided a method for testing open and short circuits of pattern electrodes using a noncontact type single side probe device including an exciter electrode and a sensor electrode of a noncontact probe electrode as a single module, the method including: applying AC power to one end of each of the pattern electrodes formed on a panel through the noncontact probe electrode of the noncontact single side probe device, measuring an electrical variation value using the noncontact probe electrode, and testing the open and short circuits of the pattern electrodes.

In accordance with yet another aspect of the present invention, there is provided a method for testing open and short circuits of pattern electrodes using noncontact type single side probe devices each including an exciter electrode and a sensor electrode of a noncontact probe electrode as a single module, the method including: arranging the noncontact type single side probe devices at both ends of the pattern electrodes formed on a panel, applying different frequencies to the pattern electrodes through the noncontact probe electrode, measuring an electrical variation value using the noncontact probe electrodes, and testing the open and short circuits of the pattern electrodes.

In accordance with yet another aspect of the present invention, there is provided a method for testing open and short circuits of pattern electrodes using noncontact type single side probe devices each including an exciter electrode and a sensor electrode of a noncontact probe electrode as a single module, the method including: arranging the noncontact type single side probe devices at both ends of the pattern electrodes formed on a panel, applying an identical frequency to the pattern electrodes such that the identical frequency is applied to the pattern electrodes separated from each other, measuring an electrical variation value using the noncontact probe electrodes, and testing the open and short circuits of the pattern electrodes.

According to the present invention, since AC power is applied to one end of a pattern electrode to be tested using a noncontact single side probe device including an exciter electrode and a sensor electrode adjacent to the exciter electrode of a noncontact probe electrode as a single module, and an electrical variation value is measured through the noncontact probe electrode to determine an open or short circuit of the pattern electrode, both the open and short circuits of pattern electrodes can be tested by scanning only one end of the pattern electrode. Since a pair of exciter electrodes and a pair of sensor electrodes are included, voltages having opposite phases are applied to the pair of the exciter electrodes and a differential voltage between voltages of the pair of sensor electrodes is used, a sharp boundary is formed to distinguish between the adjacent pattern electrodes to increase spatial resolution and a signal-to-noise ratio can be improved due to common mode noise.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

Figure 1:
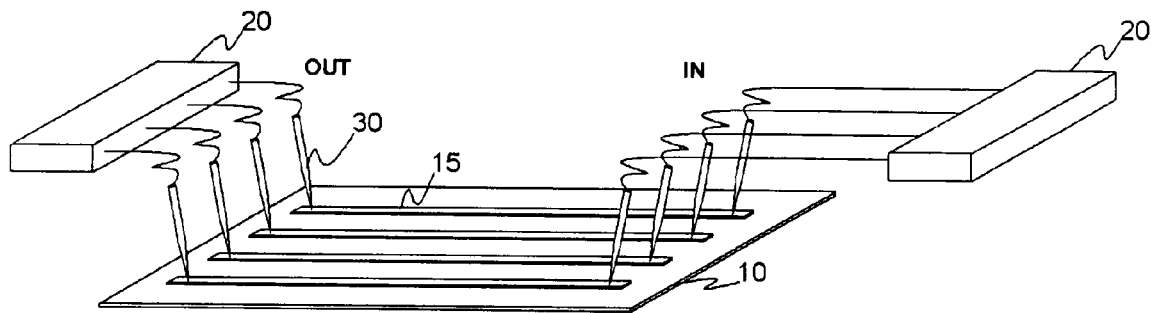
FIG. 1 is a view showing a general method of testing open and short circuits of pattern electrodes.

While the invention has been shown and described with respect to the preferred embodiments, it will be understood by those skilled in the art that various changes and modifications may be made without departing from the scope and spirit of the invention. Thus, the scope of the invention should not be limited by the embodiments of the present invention. The same portions as, the prior art are denoted by same reference numerals and terms.

Figure 2:
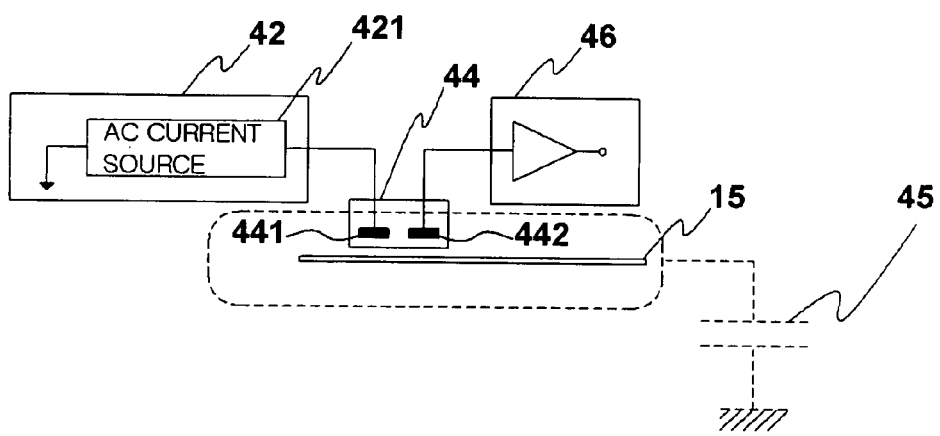
FIG. 2 is a view showing the configuration of a noncontact type single side probe device according to a first embodiment of the present invention.

FIG. 2 is a view showing the configuration of a noncontact type single side probe device according to a first embodiment of the present invention.

As shown, the noncontact type single side probe device 40 according to the present embodiment includes a noncontact probe electrode 44 including an exciter electrode 441 for feeding AC current to a pattern electrode 15 to be tested in a noncontact state and a sensor electrode 442 for sensing a variation in voltage of the pattern electrode 15, an AC current source 421 for feeding the AC current to the exciter electrode 441 of the noncontact probe electrode 44, and a sensor 46 for measuring the variation in voltage sensed by the sensor electrode 442 of the noncontact probe electrode 44.

Figure 3:
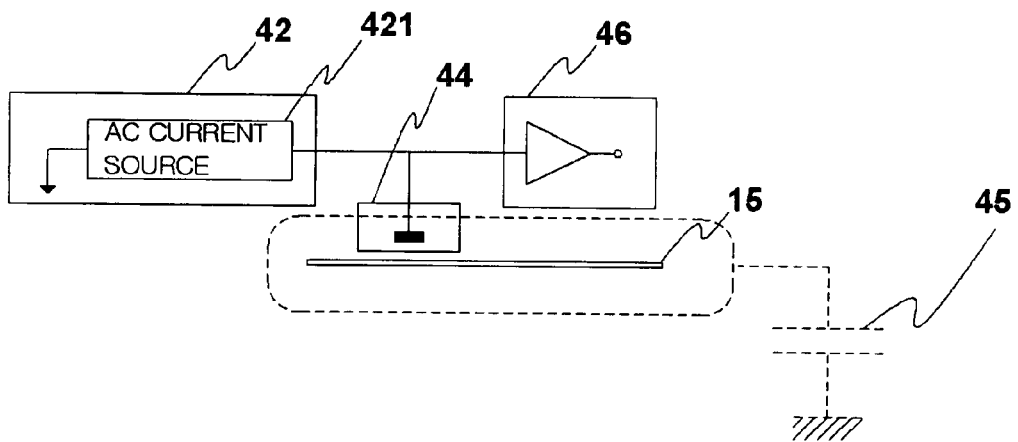
FIG. 3 is a view showing the configuration of a noncontact type single side probe device according to a second embodiment of the present invention.

At this time, as shown in FIG. 3, the noncontact probe electrode 44 may include an exciter electrode 441 and a sensor electrode 442, both of which are integrally formed with each other.

A power feeding section 42 includes the AC current source 421 for applying the AC current. The AC current source 421 applies the AC current to the noncontact probe electrode 44 so as to check the open or short circuit of the pattern electrode 15 via the variation in voltage measured by the noncontact probe electrode 44.

Figure 4:
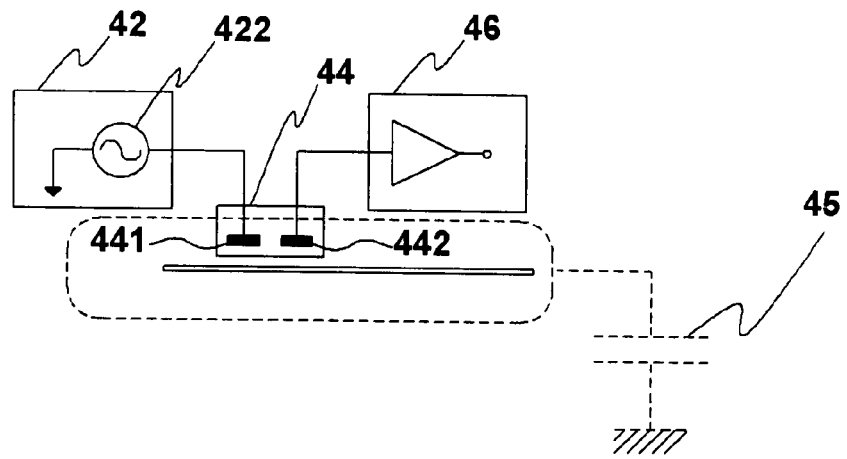
FIG. 4 is a view showing the configuration of a noncontact type single side probe device according to a third embodiment of the present invention.

FIG. 4 is a view showing the configuration of a noncontact type single side probe device according to a third embodiment of the present invention.

As shown, the noncontact type single side probe device 40 according to the present embodiment includes a noncontact probe electrode 44 including an exciter electrode 441 for feeding an AC voltage to a pattern electrode 15 to be tested in a noncontact state and a sensor electrode 442 for sensing a variation in voltage of the pattern electrode 15, an AC voltage source 422 for feeding the AC voltage to the exciter electrode 441 of the noncontact probe electrode 44, and a sensor 46 for measuring the variation in voltage sensed by the sensor electrode 442 of the noncontact probe electrode 44.

A power feeding section 42 includes the AC voltage source 422 for applying the AC voltage. The AC voltage source 422 applies the AC voltage to the noncontact probe electrode 44 so as to check the open or short circuit of the pattern electrode 15 via the variation in voltage measured by the noncontact probe electrode 44.

Figure 5:
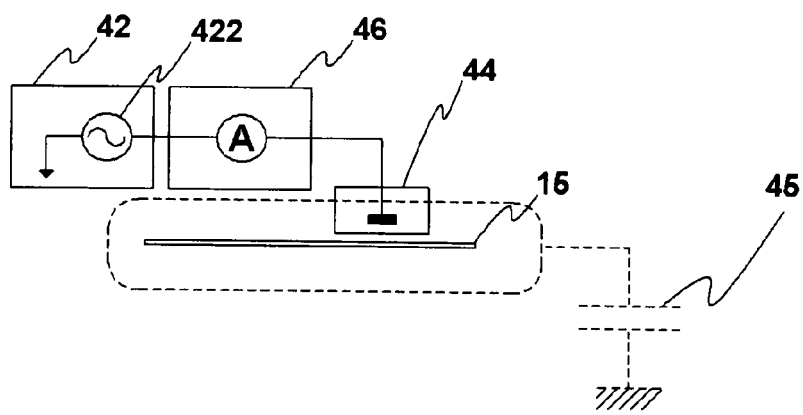
FIG. 5 is a view showing the configuration of a noncontact type single side probe device according to a fourth embodiment of the present invention.

FIG. 5 is a view showing the configuration of a noncontact type single side probe device according to a fourth embodiment of the present invention.

As shown, the noncontact type single side probe device 40 according to the present embodiment includes a noncontact probe electrode 44 for feeding power to a pattern electrode 15 to be tested in a noncontact state and sensing a variation in voltage of the pattern electrode 15, an AC voltage source 422 for feeding the AC voltage to the noncontact probe electrode 44, and a sensor 46 for measuring a variation in current flowing between the AC voltage source 422 and the noncontact probe electrode 44.

A power feeding section 42 includes the AC voltage source 422 for applying the AC voltage. The sensor 46 measures the variation in current flowing between the AC voltage source 422 and the noncontact probe electrode 44 so as to check the open or short circuit of the pattern electrode 15.

Figure 6:
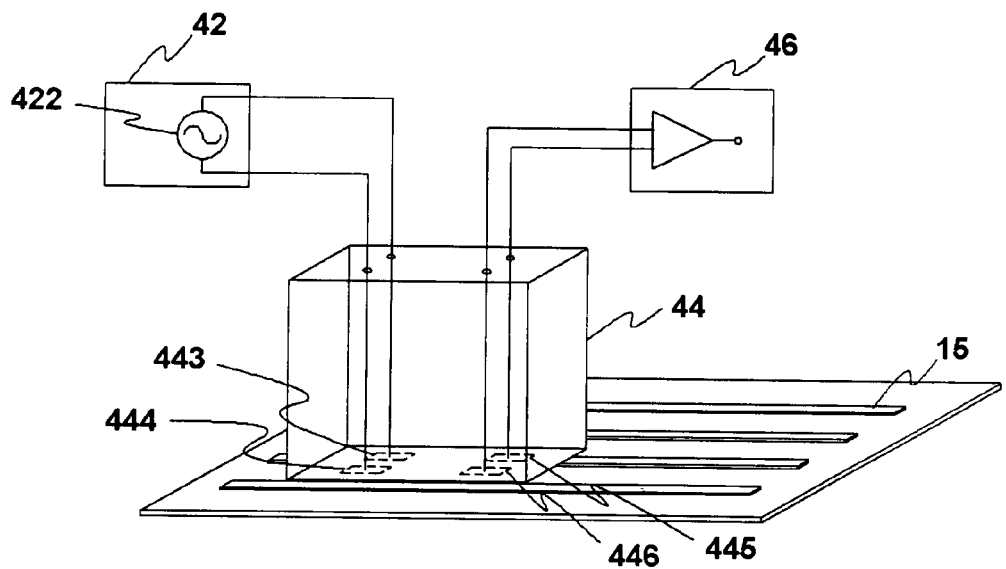
FIG. 6 is a view showing the configuration of a noncontact type single side probe device according to a fifth embodiment of the present invention.

FIG. 6 is a view showing the configuration of a noncontact type single side probe device according to a fifth embodiment of the present invention.

As shown, the noncontact type single side probe device 40 according to the present embodiment includes a noncontact probe electrode 44 including first and second exciter electrodes 443 and 444 for feeding AC power to a pattern electrode 15 to be tested in a noncontact state and first and second sensor electrodes 445 and 446 for sensing an electrical variation value of the pattern electrode 15, an AC voltage source 422 for respectively feeding AC voltages having same amplitude and a 180 degree inverted phase relationship to the first and second exciter electrodes 443 and 444, and a sensor 46 for measuring a differential voltage between the voltages measured by the first and second sensor electrodes 445 and 446.

At this time, the first exciter electrode 443 and the first sensor electrode 445 are arranged on a linear axis, and the second exciter electrode 444 and the second sensor electrode 446 are arranged on a linear axis. The first and second exciter electrodes 443 and 444 are arranged in parallel and the first and second sensor electrodes 445 and 446 are arranged in parallel.

Figure 7:
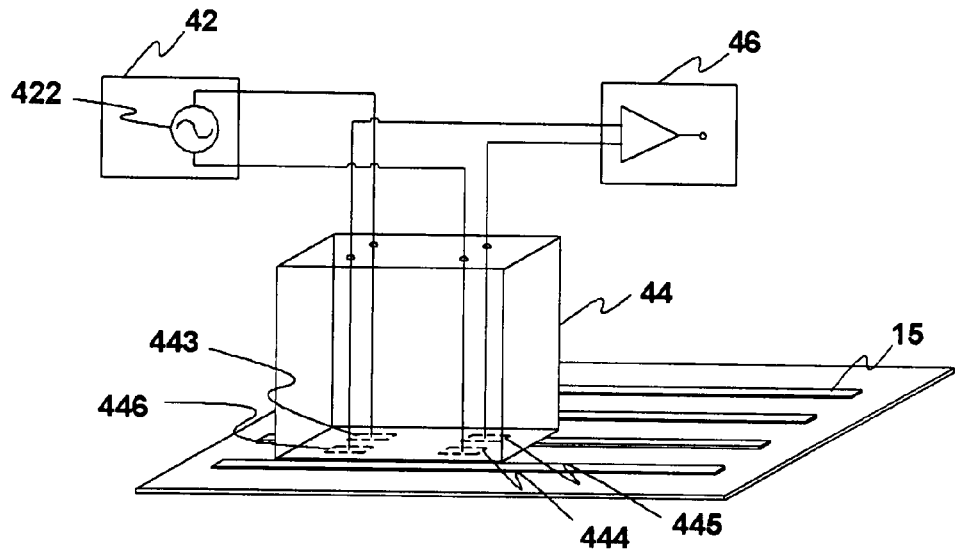
FIG. 7 is a view showing the configuration of a noncontact type single side probe device according to a sixth embodiment of the present invention.

As shown in FIG. 7, the first exciter electrode 443 and the first sensor electrode 445 may be arranged on a linear axis, and the second exciter electrode 444 and the second sensor electrode 446 may be arranged on a linear axis. The first and second exciter electrodes 443 and 444 and the first and second sensor electrodes 445 and 446 may be respectively arranged to be diagonally symmetrical to each other.

The AC voltages having opposite phases are applied through the first and second exciter electrodes 443 and 444 to form a phase boundary between the first and second exciter electrodes 443 and 444, and a differential voltage between voltages of the first and second sensor electrodes 445 and 446 is measured such that a sharp boundary between the first and second exciter electrodes 443 and 444 and between the first and second sensor electrodes 445 and 446. Accordingly, it is possible to improve spatial resolution and improve a signal-to-noise (S/N) ratio due to removal of common mode noise. Thus, it is possible to check the open or short circuit of the pattern electrode 15 with higher spatial resolution via the precise probe effect of the fine pattern electrode 15 by distinguishing between variations in voltage of adjacent pattern electrodes 15.

Figure 8:
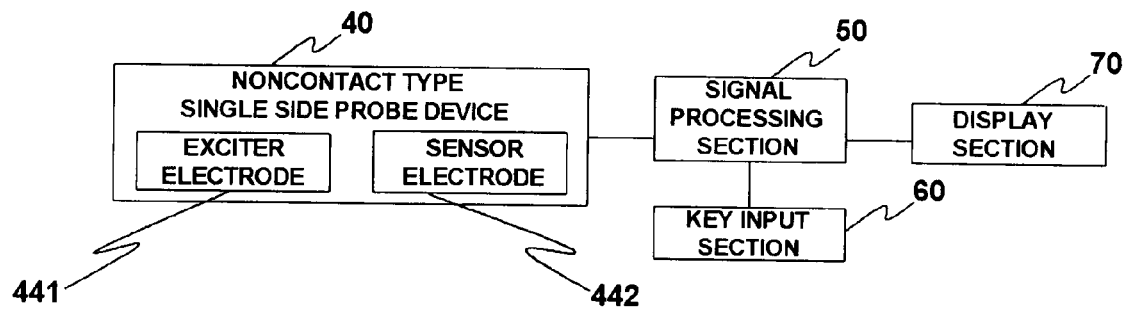
FIG. 8 is a block diagram showing an apparatus for testing open and short circuits of pattern electrodes using the noncontact type single side probe device according to the present invention.

FIG. 8 is a block diagram showing an apparatus for testing open and short circuits of pattern electrodes using the noncontact type single side probe device according to the present invention.

As shown, the apparatus includes a noncontact type single side probe device 40 for applying AC power to one end of each of pattern electrodes 15 through an exciter electrode 441 in a noncontact state while scanning the pattern electrodes 15 and measuring an electrical variation value by a sensor electrode 442 arranged adjacent to the exciter electrode 441, a signal processing section 50 for checking an open or short circuit through the electrical variation value measured by the noncontact type single side probe device 40, a display section 70 for displaying the electrical variation value measured by the noncontact type single side probe device 40 and an operation state of the signal processing section 50, and a key input section 60 for selecting the operation state of the signal processing section 50.

Figure 9:
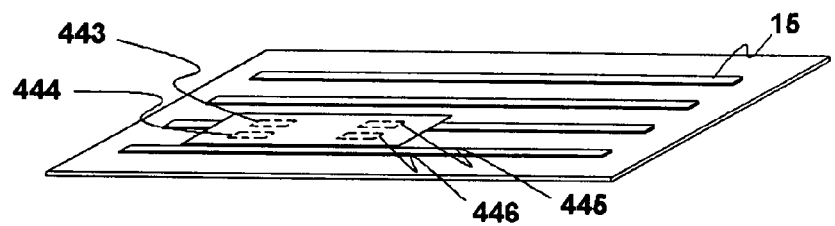
FIG. 9 is a view showing an example of testing open and short circuits of pattern electrodes using the noncontact type single side probe device according to the present invention.

FIG. 9 is a view showing an example of testing open and short circuits of pattern electrodes using the noncontact type single side probe device according to the present invention.

The noncontact type single side probe device 40 includes first and second exciter electrodes 443 and 444 and first and second sensor electrodes 445 and 446 and tests the open and short circuits of the pattern electrodes 15 at one side of each of the pattern electrodes in a noncontact state while scanning the pattern electrodes 15.

At this time, the first and second exciter electrodes 443 and 444 are arranged in parallel and the first and second sensor electrodes 445 and 446 are arranged in parallel. The first exciter electrode 443 and the first sensor electrode 445 are arranged on a linear axis, and the second exciter electrode 444 and the second sensor electrode 446 are arranged on a linear axis.

The AC voltage source 422 for applying an AC voltage to the first exciter electrode 443 and the second exciter electrode 444 of the noncontact type single side probe device 40 uses a voltage of 200 V to 300 V with a frequency ranging from 1 KHz to less than several tens KHz.

If the frequency of the voltage applied by the AC voltage source 422 is less than 1 KHz, the travel speed of the probe device 40 is restricted and thus its realization is impossible. In contrast, if the frequency of the voltage applied by the AC voltage source 422 is greater than several tens KHz, an impedance between the pattern electrodes 15 decreases and check resolution deteriorates.

Since AC voltage source 422 for applying the AC voltage with a frequency ranging from 1 KHz to less than several tens KHz is used, a shielded coaxial cable or tri-axial cable is used in a line for connecting the first and second exciter electrodes 443 and 444 and the first and second sensor electrodes 445 and 446 so as to prevent the signal from leaking.

Accordingly, when the AC voltage is applied to the first exciter electrode 443 of the noncontact type single side probe device 40 which travels on the pattern electrodes 15, charges corresponding to the level of the AC voltage are stored in the pattern electrodes 15 and the electrical variation value is measured by the first sensor electrode 445, thereby checking the open and short circuits of the pattern electrodes 15.

In the present invention, a differential voltage between voltages measured by the first and second sensor electrodes 445 and 446 is read and the open or short circuits of the pattern electrodes 15 are checked on the basis of a variation in voltage. Accordingly, the boundary between a pattern electrode 15, to which power is fed, and a pattern electrode 15, to which power is not fed, is surely distinguished by the differential voltage between the first and second sensor electrodes 445 and 446 such that sensitivity can be improved. Since the variation in voltage increases when an open or short circuit occurs, a failure can be efficiently detected.

By applying voltages having different phases to adjacent pattern electrodes 15 through the first and second exciter electrodes 443 and 444, it is possible to distinguish between the pattern electrodes 15 to improve sensitivity.

Figure 10:
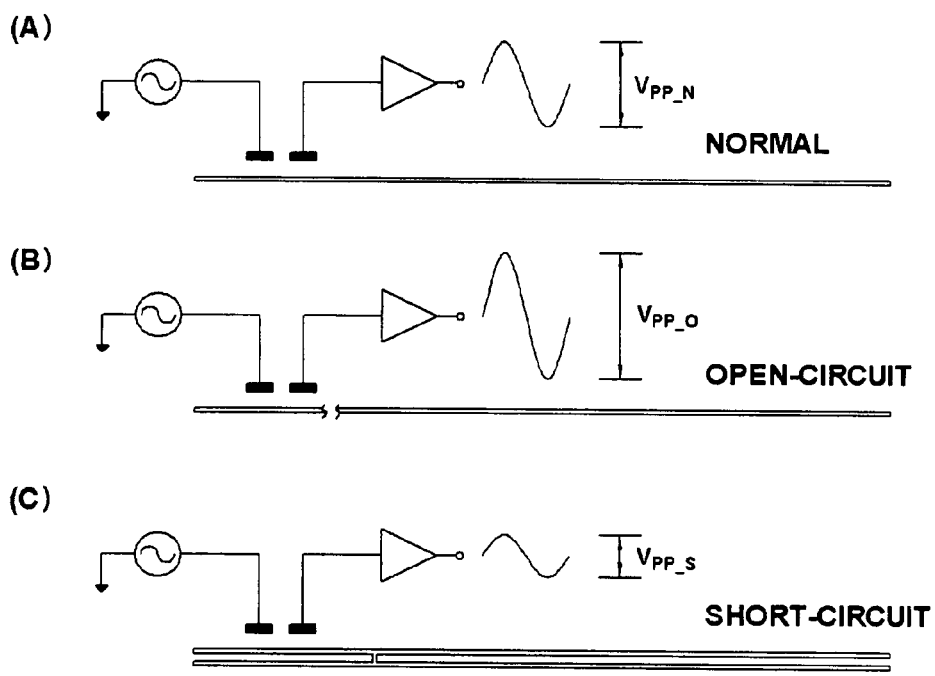
FIG. 10 is a view showing waveforms measured by the apparatus for testing the open and short circuits using the noncontact type single side probe device according to the present invention.

A voltage measured after feeding the AC voltage while scanning the pattern electrodes 15 is shown in FIG. 10.

At this time, a voltage value measured after applying an AC voltage to a normal pattern electrode 15 by the noncontact type single side probe device 40 is $V_{PP\_N}$ as shown in FIG. 10A. If the pattern electrode 15 is open-circuited as shown in FIG. 10B, the whole area of the pattern electrode 15 decreases and the capacitance of a parasitic capacitor 45 formed by ambient ground in the vicinity of the pattern electrode 15 decreases. Accordingly, in this case, since the same quantity of charges are formed in a small area to increase the voltage, the measured voltage value of the pattern electrode 15 is $V_{PP\_O}$, which is larger than the voltage value $V_{PP\_N}$ of the normal pattern electrode 15.

Meanwhile, if the pattern electrode 15 is short-circuited to an adjacent pattern electrode 15 as shown in FIG. 10C, the whole area of the pattern electrode 15 increases and the capacitance of the parasitic capacitor 45 formed by ambient ground in the vicinity of the pattern electrode 15 increases. Accordingly, in this case, since the same quantity of charges are formed in a large area to decrease the voltage, the measured voltage value of the pattern electrode 15 is $V_{PP\_S}$, which is smaller than the voltage value $V_{PP\_N}$ of the normal pattern electrode 15.

When the voltage value of the pattern electrode 15 is higher than that of the normal pattern electrode 15 through a variation in voltage measured after applying the AC voltage while scanning one side of each of the pattern electrodes 15 using the noncontact type single side probe device 40, the pattern electrode 15 is determined to be open-circuited and the determined result is displayed and, if the voltage value of the pattern electrode 15 is lower than that of the normal pattern electrode 15, the pattern electrode 15 is determined to be short-circuited and the determined result is displayed.

A control command is input through the key input section 60 to control the processed state of the signal processing section 50.

Figure 11:
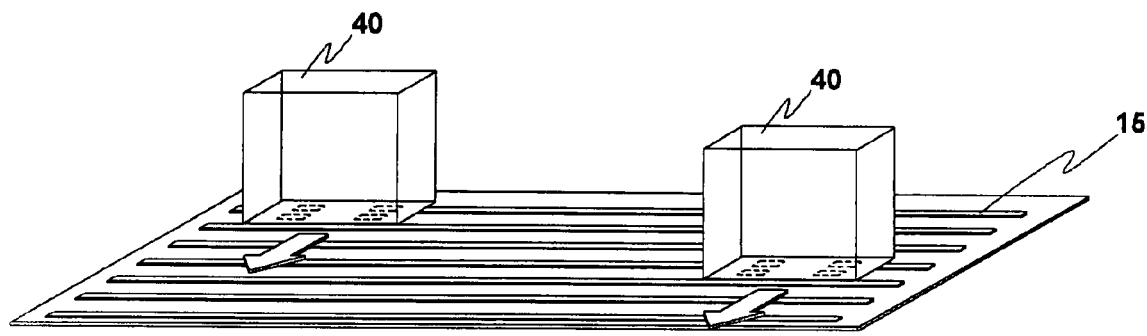
FIG. 11 is a view showing another example of testing open and short circuits of pattern electrodes using the noncontact type single side probe device according to the present invention.

When a variation in voltage is measured using the noncontact type single side probe device 40 while scanning the pattern electrodes 15 only at one side of each of the pattern electrodes 15 and an open circuit occurs at a position close to the other end of the pattern electrode 15, the area reduction decreases, voltage rising effect is low and thus the open circuit cannot be detected. In order to solve this problem, as shown in FIG. 11, the both ends of the pattern electrodes 15 are simultaneously scanned using the noncontact type single side probe devices 40 so as to improve the accuracy of the test.

At this time, the pattern electrode 15 may be tested using different frequencies or different pattern electrodes 15 may be simultaneously tested using an identical frequency such that the identical frequency is applied to the noncontact probe electrodes separated from each other.

As described above, according to the present invention, the open and short circuits of pattern electrodes can be tested by one scanning process by feeding power to one end of each of the pattern electrodes and sensing an electrical variation value using a noncontact type single side probe device including an exciter electrode and a sensor electrode as a single module.

Since the open and short circuits of the pattern electrodes are tested using the noncontact type single side probe device, the pattern electrode can be prevented from being damaged due to a contact failure or pressurized contact and the life span of the probe device can increase compared to a contact type probe device.

Since the open and short circuits are tested while scanning one ends of the pattern electrodes, the configuration of the device is simple and the test can be easily performed by the comparison with the same pattern electrode, even in the pattern electrode having a shape other than a linear shape.

Test sensitivity can be improved by a pair of sensor electrodes using a differential voltage between a pair of exciter electrodes having opposite phases.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An apparatus for testing open and short circuits of a plurality of pattern electrodes formed on a panel while scanning the pattern electrodes using a non-contact type single side probe device, the apparatus comprising:

the non-contact type single side probe device which feeds AC power to one end of each of the pattern electrodes through a non-contact probe electrode and measures an electrical variation value of the non-contact probe electrode according to a variation of capacitance of a parasitic capacitor by ambient ground in a vicinity of the pattern electrodes;

a signal processing section which determines the open or short circuits by the electrical variation value measured by the non-contact type single side probe device.

2. The apparatus according to claim 1, wherein the non-contact type single side probe device includes:

the non-contact probe electrode which feeds power to a pattern electrode in a non-contact state and senses the electrical variation value;

a power feeding section which applies the AC power to the non-contact probe electrode; and a sensor which measures the electrical variation value of the non-contact probe electrode.

3. The apparatus according to claim 2, wherein the power feeding section includes an AC current source for applying AC current, and the sensor measures a variation in voltage.

4. The apparatus according to claim 3, wherein the non-contact probe electrode includes:

an exciter electrode which is connected to the power feeding section, for applying the AC current; and a sensor electrode which is connected to the sensor, for sensing the variation in voltage.

5. The apparatus according to claim 4, wherein the exciter electrode and the sensor electrode of the non-contact probe electrode are integrally formed with each other.

6. The apparatus according to claim 2, wherein the power feeding section includes an AC voltage source for applying an AC voltage, and the sensor measures a variation in voltage.

7. The apparatus according to claim 6, wherein the non-contact probe electrode includes:

an exciter electrode which is connected to the power feeding section, for applying the AC voltage; and a sensor electrode which is connected to the sensor, for sensing the variation in voltage.

8. The apparatus according to claim 2, wherein the power feeding section includes an AC voltage source for applying an AC voltage, and the sensor measures a variation in current flowing between the AC voltage source and the non-contact probe electrode.

9. The apparatus according to claim 2, wherein the non-contact probe electrode includes:

first and second exciter electrodes which feed the AC voltage; and first and second sensor electrodes which measure the variation in voltage.

10. The apparatus according to claim 9, wherein the first exciter electrode and the first sensor electrode are arranged on a linear axis, the second exciter electrode and the second sensor electrode are arranged on a linear axis, the first and second exciter electrode are arranged in parallel, and the first and second sensor electrodes are arranged in parallel.

11. The apparatus according to claim 9, wherein the first exciter electrode and the first sensor electrode are arranged on a linear axis, the second exciter electrode and the second sensor electrode are arranged on a linear axis, and the first and second exciter electrodes and the first and second sensor electrodes are respectively arranged to be diagonally symmetrical to each other.

12. The apparatus according to claim 9, wherein the power feeding section respectively feeds AC voltages having same amplitude and a 180 degree inverted phase relationship to the first and second exciter electrodes.

13. The apparatus according to claim 9, wherein the sensor measures a differential voltage between the voltages measured by the first and second sensor electrodes.

* * * * *